United States Patent

Schueller et al.

Patent Number: 5,602,422
Date of Patent: Feb. 11, 1997

[54] FLEXIBLE LEADS FOR TAPE BALL GRID ARRAY CIRCUIT

[75] Inventors: Randolph D. Schueller, Austin; David J. Windschitl, Leander, both of Tex.

[73] Assignee: Minnesota Mining and Manufacturing Company, Saint Paul, Minn.

[21] Appl. No.: 491,229

[22] Filed: Jun. 16, 1995

[51] Int. Cl.$^6$ ............................ H01L 23/48; H01L 23/52; H01L 29/40
[52] U.S. Cl. .................... 257/738; 257/737; 257/772; 257/774; 257/780
[58] Field of Search ..................................... 257/734, 735, 257/737, 738, 780, 772, 774, 775

[56] References Cited

U.S. PATENT DOCUMENTS

| | | | |
|---|---|---|---|
| 4,893,172 | 1/1990 | Matsumoto et al. | 257/738 |
| 5,203,075 | 4/1993 | Angulas et al. | 29/830 |
| 5,359,222 | 10/1994 | Okutomo et al. | 257/659 |
| 5,420,460 | 5/1995 | Massingill | 257/693 |

FOREIGN PATENT DOCUMENTS

| | | |
|---|---|---|
| 0349000A2 | 6/1988 | European Pat. Off. . |
| 0532898A2 | 3/1993 | European Pat. Off. . |
| 4417670 | 12/1994 | Germany . |

OTHER PUBLICATIONS

Patent Abstracts of Japan: vol. 11, No. 209 (E–521), 7 Jul. 1987 & JP,A,62,62 030342 (NEC), 9 Feb. 1987, see abstract.

*Primary Examiner*—Carl Whitehead, Jr.
*Attorney, Agent, or Firm*—Gary L. Griswold; Walter N. Kirn; Matthew B. McNutt

[57] ABSTRACT

A flexible circuit construction includes a polymeric sheet, via holes in the sheet and metal circuitry disposed on the sheet. The circuitry terminates at a cantilever end partially spanning the via hole to which a solder ball is subsequently attached. The cantilever end allows the solder ball to move relative to the flexible circuit and thus compensate for misalignment and-differential thermal expansion effects.

2 Claims, 2 Drawing Sheets

5,602,422

FLEXIBLE LEADS FOR TAPE BALL GRID ARRAY CIRCUIT

FIELD OF THE INVENTION

The present invention relates generally to flexible circuit constructions, particularly to tape ball grid array (TBGA) flexible circuit constructions, and more particularly to the contacts formed on such circuit constructions.

BACKGROUND OF THE INVENTION

A common packaging construction for an electronic device is the so-called quad flat pack wherein an integrated circuit is encapsulated with a polymer for protection. The structure is square with a number of flexible leads exiting the encapsulate for connection to another electronic component such as a circuit board. The flexibility of the leads compensates for differential thermal expansion between the polymer comprising the quad flat pack and the circuit board and thus largely prevents cracking or breakage of the solder joints which connect the leads to the circuit board.

Tape ball grid array (TBGA) devices have been proposed as a substitute for the quad flat pack structure in order to accommodate integrated circuits with higher numbers of inputs and outputs and to reduce production costs. These TBGA devices include a flexible polymeric base sheet on which is disposed a metal layer on at least one side. The base is typically adhesively attached to a metal stiffener and an array of solder balls are attached to the circuitry defined by the metal layer to allow for connection to a circuit board. Unfortunately, such an arrangement does not allow much flexibility of the solder balls relative to the base and so cracking or breakage of the solder connection between the solder balls and the metal layer of the polymeric base is a problem. Improvement of the construction of the TBGA package is required to match the performance of the quad flat pack.

SUMMARY OF THE INVENTION

The TBGA package according to the present invention is resistant to fatigue stresses which occur in ball grid array solder joints during thermal cycling due to differences in the coefficient of thermal expansion between the package and the board. According to the invention, a flexible circuit board is constructed to include a cantilever beam which spans a via hole at the end of the flexible circuitry. A solder ball is attached to the cantilever beam by conventional methods. The cantilever beam is preferably bent downwardly which provides the ball with some mobility relative to the flexible circuit. This added mobility reduces the level of stress built up during thermal cycling thereby increasing the durability of the package, and also improves coplanarity between the package and the board which ensures that each ball contacts the solder paste during surface mounting.

In particular, the invention is a flexible circuit construction for attachment to solder balls comprising a flexible polymeric sheet having two major surfaces, at least one via hole extending through the polymeric sheet, metal disposed on at least one major surface of the polymeric layer and defining electrical circuitry terminating at a lead at the via hole, the lead extending only part way across the via hole to define a cantilever end free to move in directions normal to the major surfaces of the polymeric sheet. The via hole may be extended along the lead or the polymeric sheet may be cut adjacent the lead to increase the effective length of the cantilever end and thus increase the flexibility and range of motion of the cantilever end.

BRIEF DESCRIPTION OF THE DRAWINGS

The present invention will be described with respect to the accompanying drawings, wherein like numbers refer to like parts in the several views, and wherein.

DESCRIPTION OF THE PREFERRED EMBODIMENT

Figure 1:
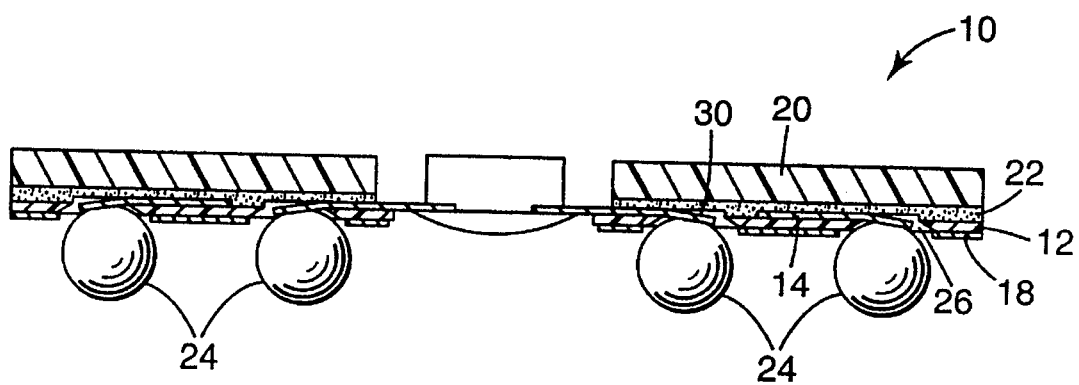
FIG. 1 is a cross-sectional view of a flexible circuit construction according to the invention with solder balls attached thereto.

FIG. 1 illustrates a flexible circuit, generally indicated as 10, and an environment in which it is typically used. The flexible circuit 10 includes a polymeric sheet 12, usually of polyimide, and metal, usually copper, disposed on at least one of the major surfaces of the sheet 12 to define electrical circuitry 14. In the illustration of FIG. 1, the upper layer of metal 14 defines signal traces 16 and the lower layer defines a ground plane 18. In some instances, the ground plane 18 is not present and so the polymeric sheet 12 includes only one layer of metal.

The flexible circuit 10 is typically attached to a stiffener 20 by means of an adhesive 22. The stiffener 20 lends dimensional stability to the flexible circuit 10. The integrated circuit is typically connected to the signal traces 16 and ground plane 18, by any conventional means such as wire bonding, thermal compression bonding of flip chip techniques.

The assembly of the flexible circuit 10, its stiffener 20 and the other components are typically attached to a conventional printed circuit board. This attachment is by means of solder balls 24 soldered to the flexible circuit 10, and in turn mass reflow soldered to the printed circuit board. Attachment of the solder balls 24 to the flexible circuit 10 is accomplished by soldering each ball 24 to the proper circuit trace 16 through a via hole 26 formed in the polymeric sheet 12. In conventional flexible circuit constructions the circuit trace 16 spans the via hole 26 and thus is maintained rigidly in place relative to the flexible circuit 10. This rigidity results in stresses being built up in the assembly, particularly at the solder ball 24 solder joints, as the various components change dimensions as a result of temperature changes. In time, these stresses result in breakage of the components or their areas of attachment and may result in failure of the device.

Figure 2:
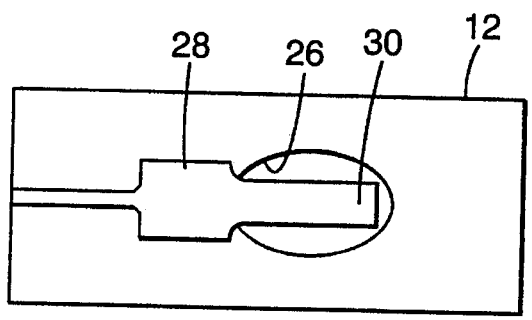
FIG. 2 is a top plan view of a portion of the flexible circuit of FIG. 1 showing the end of one circuit trace.

The present invention is designed to eliminate these stresses and does so by providing circuit traces 16 which terminate at the via hole 26 short of completely spanning the hole 26. As best seen in FIG. 2, the circuit trace 16 terminates in an enlarged lead 28 which includes a cantilever end 30 which extends only part way across the via hole 26.

The solder ball 24 is attached to the cantilever end 30 by conventional means and is free to move relative to the polymeric sheet 12 by virtue of the fact that the cantilever end 30 can move relative to the sheet 12 unlike circuit traces in the past. The flexibility and spring constant of the free end 30 can be adjusted by choice of the width and thickness of the cantilever end 30.

Figure 3:
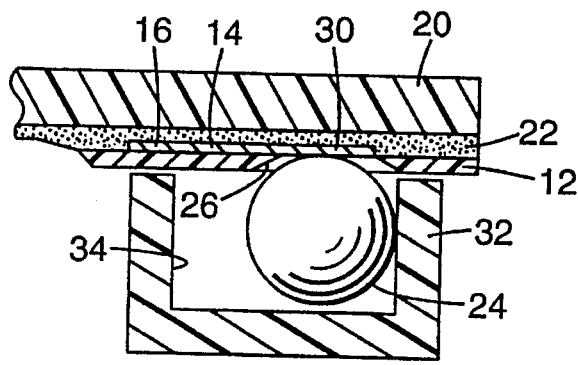
FIG. 3 is a cross-sectional view of a portion of the flexible circuit of FIG. 1 with a solder ball attached and a cross-sectional view of a device for manipulating the solder ball after attachment to the flexible circuit.

FIG. 3 illustrates a method of increasing this mobility of the solder ball 24 by bending the cantilever end 30 into the via hole 26. A fixture 32 includes a channel 34 sized to accept the solder ball 24. Once positioned, the fixture 32 is moved relative to the flexible circuit 10 (to the left as viewed in FIG. 3) to cause the cantilever end 30 to bend to the position shown in FIG. 4. It should be understood that FIG. 3 illustrates only one of many solder balls 24 which are engaged simultaneously. The solder balls 24 are typically arranged in a number of rows and columns, hence the "array" portion of tape and ball grid array. The fixture will be built with a series of channels 34 to accommodate the number of rows of solder balls 24 which are present in the array. Of course, FIG. 3 illustrates only one method of deflecting the solder balls 24 and others are possible. For example, it would be possible to deflect the cantilever ends 30 from above with projections which contact the cantilever ends 30.

Figure 4:
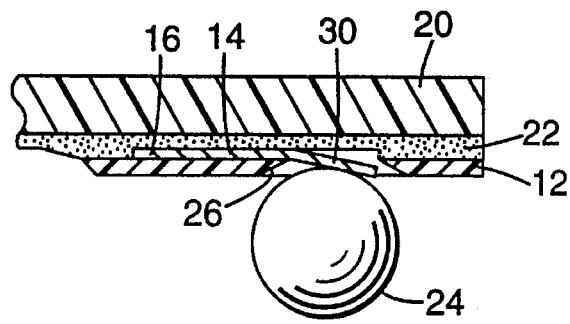
FIG. 4 is a cross-sectional view of the flexible circuit of FIG. 1 with a solder ball attached showing the result of manipulating the solder ball by the device of FIG. 3.

The final configuration of the cantilever end 30 and the solder ball 24 shown in FIG. 4 allows the solder ball 24 to move in the vertical and horizontal directions to accommodate movement of the components to which it connects due to thermal effects and to cure any misalignment of solder balls 24 due to such things as manufacturing tolerances, differences in size of solder balls 24 or warpage of the components.

Figure 5:
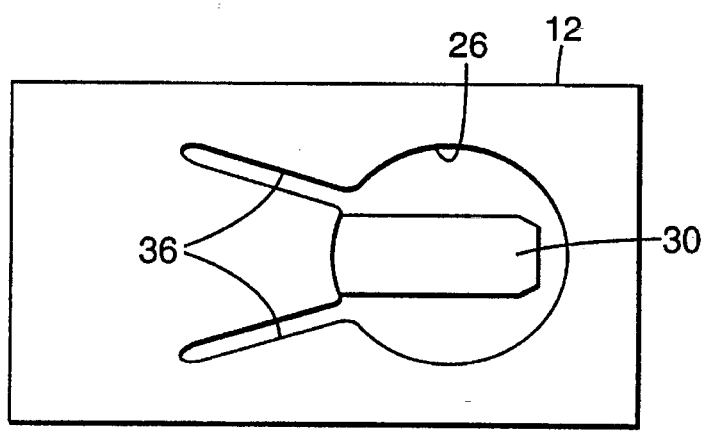
FIG. 5 illustrates an alternate embodiment of a flexible circuit according to the invention.

FIG. 5 illustrates one method of increasing the flexibility and range of the cantilever end 30. Here two cuts 36 are made in the polymeric sheet 12 adjacent and in the direction of the circuit trace 16. This allows the sheet 12 to bend in the vicinity of the cantilever end 30 and add to the motion which is available to the solder ball 24.

Figure 6:
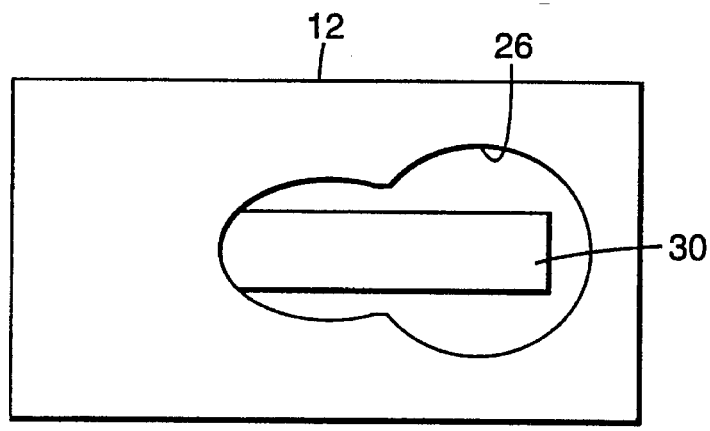
FIG. 6 illustrates a second alternate embodiment of a flexible circuit according to the invention.

FIG. 6 illustrates another method of increasing the flexibility and range of the cantilever end 30. Here, the shape of the via hole 26 is modified in shape to extend further down the length of the circuit lead 28 and thus increase the free length of the cantilever end 30.

Thus there has been described an improved flexible circuit construction which provides for movement of solder balls in tape ball grid array devices and so reduces the effects of thermal expansion and increases the ability of the assembly to accommodate misalignment. Although the invention has been described with respect to only a limited number of embodiments, it will be apparent to those skilled in the art that many modifications are possible. For example, the shape of the cantilever end 30 can vary widely. Also, one cut 36 or differently shaped cuts 36 can be utilized to increase flexibility of the cantilever end 30 rather than the cuts shown in FIG. 5. As a further example, although the cantilever end is shown located on the opposite side of the polymeric sheet relative to the solder ball, the lead and its cantilever end could be located on the same side of the sheet as the solder ball if a solder mask were used to define the cantilever ends upon which the solder balls are subsequently attached. These cantilever ends are then deflected in a similar manner to that described above. Also, the cantilever end arrangement is not limited to flexible circuit construction. The principle is equally applicable to rigid printed circuit boards.

The invention claimed is:

1. A flexible circuit for attachment to a printed circuit board, said flexible circuit comprising:

a base comprising a flexible polymeric sheet, said base having two major surfaces;

a via hole through said base;

a conductive trace disposed on a first major surface of said base and defining electrical circuitry terminating at a cantilever end spanning a portion of said via hole, said cantilever end being angularly displaced from said conductive trace to extend into said via hole;

an elongate slit terminating at one end thereof at said via hole to permit greater movement of said cantilever end relative to the plane of said flexible polymeric sheet; and a solder ball attached to said cantilever end from a second major surface of said base such that a subsequent attachment of a printed circuit board to said flexible circuit from said second major surface will accommodate physical displacement of said flexible circuit and said printed circuit board.

2. The flexible circuit according to claim 1, wherein said flexible polymeric sheet includes two elongate slits each terminating at one end thereof at said via hole and each extending from said via hole on an opposite side of said conductive trace to allow greater movement of said cantilever end relative to the plane of said flexible polymeric sheet.

* * * * *